(12) United States Patent
Yoshida et al.

(10) Patent No.: US 9,444,071 B2
(45) Date of Patent: Sep. 13, 2016

(54) ORGANIC ELECTROLUMINESCENT PANEL

(75) Inventors: Ayako Yoshida, Kawasaki (JP);
Shinichi Ishizuka, Kawasaki (JP);
Takuo Shinohara, Kawasaki (JP)

(73) Assignee: PIONEER CORPORATION,
Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/410,748

(22) PCT Filed: Jun. 28, 2012

(86) PCT No.: PCT/JP2012/066592
§ 371 (c)(1),
(2), (4) Date: Dec. 23, 2014

(87) PCT Pub. No.: WO2014/002231
PCT Pub. Date: Jan. 3, 2014

(65) Prior Publication Data
US 2015/0325809 A1    Nov. 12, 2015

(51) Int. Cl.
*H01L 27/32* (2006.01)
*H01L 51/52* (2006.01)
*H05B 33/02* (2006.01)
*H05B 33/04* (2006.01)
*H01L 23/525* (2006.01)

(52) U.S. Cl.
CPC ....... *H01L 51/5246* (2013.01); *H01L 27/3276* (2013.01); *H01L 27/3288* (2013.01); *H05B 33/02* (2013.01); *H05B 33/04* (2013.01); *H01L 23/5256* (2013.01); *H01L 2251/5392* (2013.01); *H01L 2924/0002* (2013.01)

(58) Field of Classification Search
CPC ........... H01L 27/3283; H01L 27/3288; H01L 27/3276; H01L 51/5246; H05B 33/02; H05B 33/04
See application file for complete search history.

(56) References Cited

U.S. PATENT DOCUMENTS

| 7,439,102 B2* | 10/2008 | Kang | H01L 23/5258 257/E21.656 |
| 2006/0066223 A1* | 3/2006 | Pschenitzka | H01L 51/50 313/504 |
| 2007/0054430 A1* | 3/2007 | Nishigaki | H01L 51/5253 438/29 |

(Continued)

FOREIGN PATENT DOCUMENTS

| JP | 2001-196190 A | 7/2001 |
| JP | 2003-229262 A | 8/2003 |

(Continued)

OTHER PUBLICATIONS

WIPO ISR (English translation) PCT/JP2012/066592.*

(Continued)

*Primary Examiner* — Mohammad Islam
*Assistant Examiner* — Christina Sylvia
(74) *Attorney, Agent, or Firm* — Procopio, Cory, Hargreaves & Savitch LLP

(57) ABSTRACT

[Problem]
Provided is an organic EL panel in which on a support supporting at least one organic EL element, a connecting wire for supply of power to the organic EL is disposed, and which is capable of preventing damage of the support by heat and impact caused by melting disconnection of a fuse part that is provided in the connecting wire.
[Solution Means]
A buffer layer is disposed between a face supporting the connecting wire on the support and the fuse part.

16 Claims, 8 Drawing Sheets

(56) References Cited

U.S. PATENT DOCUMENTS

| | | | |
|---|---|---|---|
| 2011/0101314 A1* | 5/2011 | Kim | H01L 51/5203 257/40 |
| 2012/0016076 A1* | 1/2012 | Kim | C08G 73/1032 524/600 |
| 2014/0246658 A1* | 9/2014 | Yoshida | H01L 27/3283 257/40 |

FOREIGN PATENT DOCUMENTS

| | | |
|---|---|---|
| JP | 2004-214084 A | 7/2004 |
| JP | 2004-296154 A | 10/2004 |
| JP | 2007-5257 A | 1/2007 |
| JP | 2011-60680 A | 3/2011 |
| JP | 4918633 B1 | 4/2012 |
| WO | 2008/029670 A | 3/2008 |

OTHER PUBLICATIONS

International Search Report and Written Opinion dated Sep. 20, 2012, issued for International Application No. PCT/JP2012/066592.

\* cited by examiner (a)

(b)

(c)

ORGANIC ELECTROLUMINESCENT PANEL

TECHNICAL FIELD

The present invention relates to an organic electroluminescent panel.

BACKGROUND ART

An organic electroluminescent (hereinafter referred to as organic EL) panel is a light-emitting device that includes at least one organic EL element disposed on a supporting substrate, acts as a surface light source, and functions as, for example, an image display or an illuminating device. For example, in the organic EL element, a pair of electrodes including an anode and a cathode sandwiches an organic functional layer in which an organic light-emitting layer is held between a hole transport layer and an electrode transport layer, and any one of the electrodes is fixed on the supporting substrate such as a glass substrate and a resin substrate. In order to cause this organic EL element to emit light, current should be supplied through the electrode pair. For this reason, a connecting wire pair is disposed to selectively supply current to each organic EL element.

Use of the organic EL panel is not restricted to an image display. Even when the organic EL panel is used as an illuminating device, a plurality of organic EL elements are aligned in the organic EL panel in many cases. Therefore, it is general that a power supply line for supplying power from the outside to the connecting wire pair of each organic EL element is disposed on the substrate over a distribution region of the organic EL elements. In a case of an image display, the power supply line includes a plurality of horizontal line groups and vertical line groups that are crossed with the horizontal line groups, and each organic EL element is provided on each intersection of these line groups and serves as a pixel.

In the organic EL element, since the organic functional layer that is provided between the anode and the cathode has a thickness of submicron order, current leakage may be caused by fine dust or a defect of the organic functional layer. For example, when in the image display, current leakage occurs in one pixel, other pixels around the pixel may also be damaged.

As a technique for preventing damage of peripheral cells from spreading as described above, Patent Document 1 describes a procedure of blocking short-circuit current by providing a wire having a fuse function on each of a plurality of pixels. The fuse function causes melting disconnection by overcurrent during short circuit due to current leakage.

Patent Document 2 describes a technique of using a resin substrate and providing a silicon oxide film as a barrier layer against gas or the like on the resin substrate.

Patent Document 3 describes a technique of self-repairing a short circuit part by applying reverse bias voltage to electrodes to evaporate an electrode material.

Patent Document 4 discloses a technique of repairing a short circuit part by irradiating laser beam to the short circuit part, to melt and remove the short circuit part.

CITATION LIST

Patent Documents

Patent Document 1: Japanese Patent Application Laid-Open No. 2001-196190
Patent Document 2: WO2008/029670
Patent Document 3: Japanese Patent Application Laid-Open No. 2004-214084
Patent Document 4: Japanese Patent Application Laid-Open No. 2003-229262

SUMMARY OF THE INVENTION

Problem to be Solved by the Invention

When a resin substrate containing a resin material is used in a device described in Patent Literature 1, the resin substrate may be damaged by impact and heat generated by flowing overcurrent to a connecting wire pair resulting in melting disconnection of a fuse part. When the resin substrate is sealed by being covered with a barrier layer such as an oxide film, the barrier layer on the resin substrate may be damaged by impact and heat to impair a sealing performance. In this case, not only the barrier layer but also the resin substrate itself may be damaged. For example, even in an organic EL panel having a mechanically and thermally fragile support structure containing a resin material or a glass material around a substrate such as a substrate in combination of a glass with a resin, for example, a color filter substrate, a metal substrate having an insulating film formed thereon, and a hybrid substrate of a metal and a resin, there is a problem in which the support structure is damaged by melting disconnection of the fuse part.

The present invention has been made in view of the circumstances described above, and it is an object of the present invention to provide an organic EL panel that has a wire with a fuse part and can prevent an adverse effect of heat and impact generated by melting disconnection of the fuse part.

Means to Solve the Problem

An organic EL panel according to the present invention is an organic EL panel including a support, at least one organic EL element that is disposed on the support and includes an organic functional layer including an organic light-emitting layer and a pair of electrodes sandwiching the organic functional layer, at least one pair of connecting wire pairs that are connected to the respective electrodes and disposed on the support, and a sealing film that seals both the organic EL element and the connecting wire pairs together with the support, wherein any one of the connecting wire pairs has a fuse part, and a buffer layer is provided between the support and the fuse part.

BRIEF DESCRIPTION OF DRAWINGS

FIG. 2b is a cross-sectional view taken along line 2b-2b in FIG. 2a.

DESCRIPTION OF EMBODIMENTS

Figure 1:
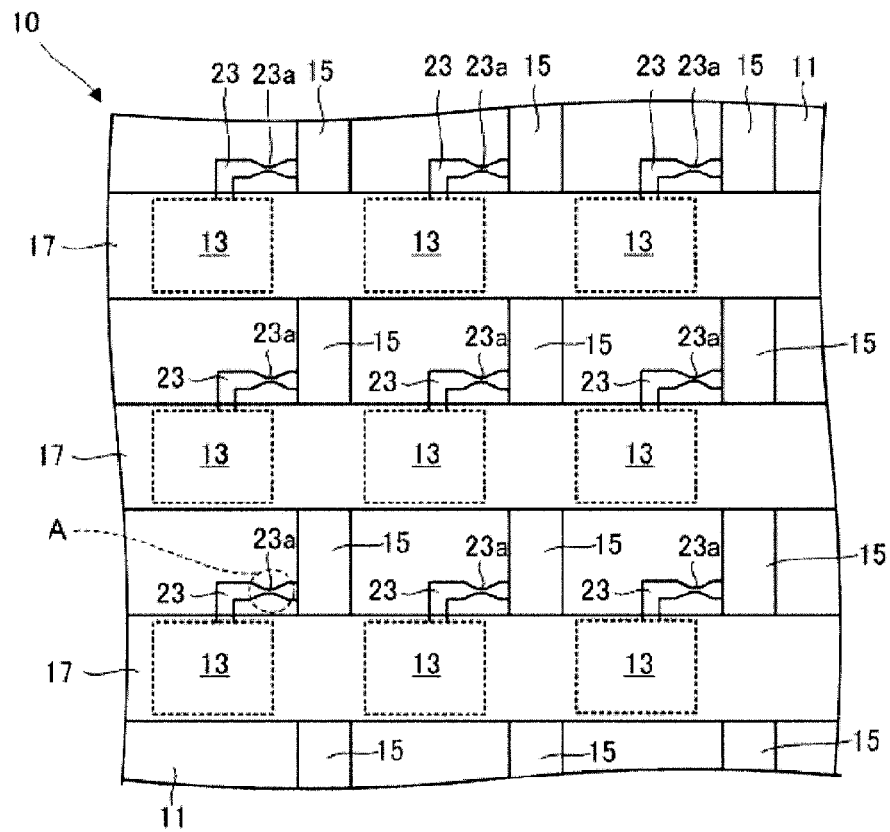
FIG. 1 is a top plan view of part of an organic EL panel according to a first embodiment of the present invention.
Figure 2A:
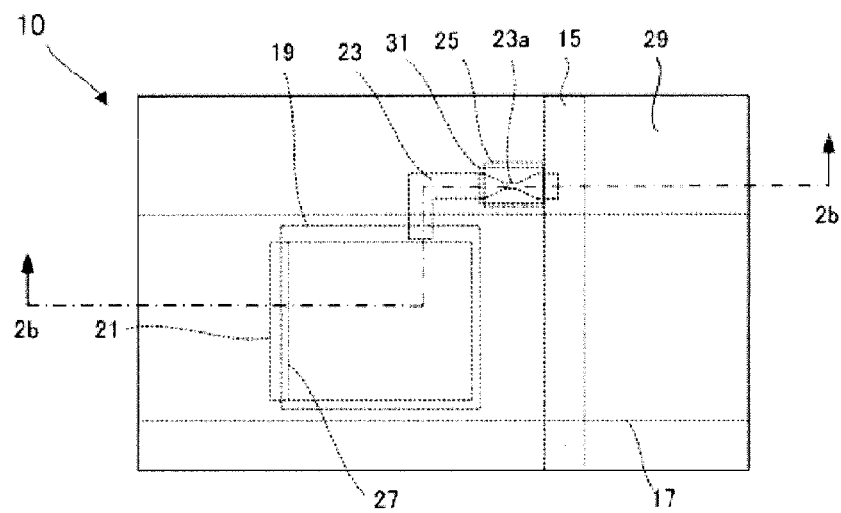
FIG. 2a is a top plane view of a unit region including one organic EL element in the organic EL panel of FIG. 1.
Figure 2B:
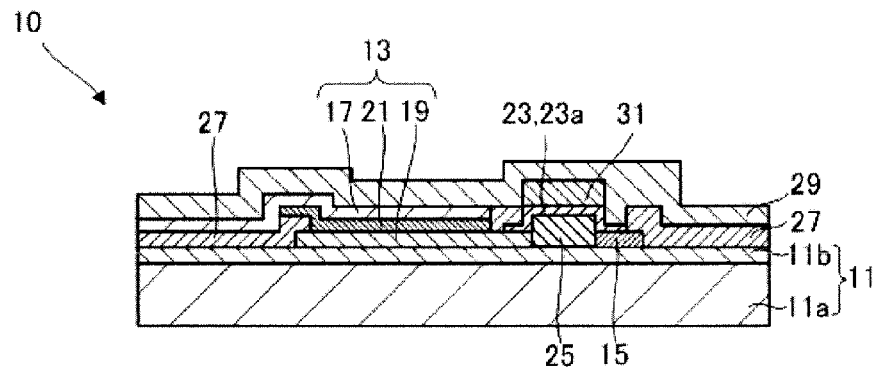
Figure 2C:
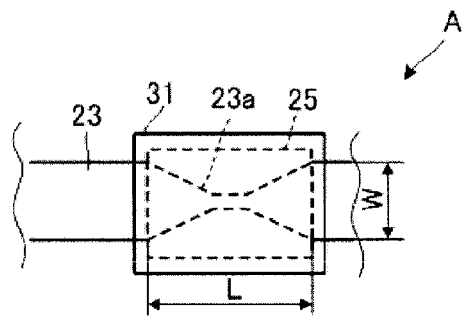
FIG. 2c is an enlarged top plane view of a fuse part according to the embodiment of FIG. 1.

Hereinafter, embodiments of the present invention will be described with reference to the drawings. In views shown below, substantially the same or equivalent components or parts are provided with the same reference signs. In FIGS. 1 and 2c, a configuration excluding an insulating layer and a sealing layer is shown for easy understanding.

First Embodiment

In an organic EL panel 10 of each of FIGS. 1 and 2a to 2c, a plurality of organic EL elements 13 are disposed in a matrix shape on a support 11. When the organic EL panel 10 is used as an image display, each of the organic EL elements 13 acts as a pixel. When the organic EL panel is used as an illuminating device, the organic EL elements 13 are driven together or selectively.

On the support 11, a power supply strip group 15 in a strip shape is disposed. As a first electrode in a strip shape, an electrode (i.e., common electrode) strip group 17 is disposed so as to be crossed with the power supply strip group 15 in a non-contact state, and each of the organic EL elements 13 is disposed in a vicinity of each intersection of the electrode strip group and the power supply strip group. As especially evident from FIG. 2b, each of the organic EL elements 13 has a layered structure including a conductive layer 19 as a second electrode in contact with a surface of the support 11, an organic functional layer 21, and one strip in the electrode strip group 17. The electrode strip group 17 is common to the plurality of organic EL elements 13 formed along each strip in the electrode strip group 17. In each of the organic EL elements 13, one end of a connecting wire 23 is connected to the conductive layer 19. When the conductive layer 19 and the support 11 are transparent, the organic EL panel is a so-called bottom emission-type light-emitting panel, in which light generated in the organic functional layer 21 is extracted from a side of the support 11.

The support 11 includes a substrate 11a and a barrier film 11b formed on the substrate 11a. The substrate 11a is made of a transparent and flexible film of a resin such as polycarbonate (PC), polyester (PET), polyethylene naphthalate (PEN), or polyether sulfone or a glass. The barrier film 11b is a film body for maintaining moisture-proof performance of the substrate 11a and preventing oxygen or moisture content from entering the organic EL elements 13 formed on the substrate 11. For example, the barrier film 11b is made of an inorganic material such as $SiO_x$, $SiO_xN_y$, $SiN_x$, $AlO_x$, $AlN_x$, or $TiO_x$.

For example, the conductive layer 19 as the second electrode is formed by patterning a light-transmissive conductive metal oxide of about 100 nm in thickness, such as indium tin oxide (ITO) and indium zinc oxide (IZO), in a rectangular shape.

Through each connecting wire 23, one strip in the power supply strip group 15 disposed on the support 11 is electrically connected to the conductive layer 19 of each organic EL element 13. For example, the connecting wire 23 is made of an alloy including tin, bismuth, or lead as a main component, more specifically solder that is a tin-based alloy, or a low-melting point metal such as a Wood's metal, a Rose's alloy, and a Newton's alloy.

The connecting wire 23 is in a strip shape as a whole, and has a line width narrower than those of other parts. Therefore, the connecting wire 23 has a fuse part 23a that has a maximum peak current lower than those of the other parts. For example, the fuse part 23a has a substantial ribbon shape that has a length L, a narrow-width part at the central part, and wide-width parts with a width W at the both ends. Since the fuse part 23a has a low maximum peak current, the fuse part 23a has function of blocking entry of short-circuit current to the organic EL elements 13 by melting disconnection. This melting disconnection is caused when short circuit is caused by leakage of current or the like in each organic EL element 13 and excessive current is supplied from the power supply strip group 15 to the organic EL element 13. The maximum peak current may be decreased by making the thickness of the fuse part 23a smaller than those of other parts of the connecting wire 23 or using a material with a melting point lower than those of materials for the other parts of the connecting wire 23 as a material for the fuse part 23a. Thus, each organic EL element 13 is connected to the power supply strip group 15 through the connecting wire 23 with the fuse part 23a. Therefore, even when short circuit occurs in one of the organic EL elements 13, driving current to the one of the organic EL elements is blocked, and damage does not spread to other organic EL elements.

A buffer layer 25 is provided between the support 11 and the fuse part 23a, and the fuse part 23a is not in contact with the support 11. The buffer layer 25 is made of an organic substance such as polyimide, acryl, or resist, and for example, has a rectangular cross section as apparent from FIG. 2b.

The buffer layer 25 is allowed to prevent damages of the barrier layer 11b constituting the support 11, and the substrate 11a under the barrier layer 11b by buffering heat generated during melting disconnection of the fuse part 23a caused by short circuit due to leakage in the organic EL elements 13 or stress due to deformation of the fuse part 23a. It is preferable that the buffer layer 25 be formed so as to cover at least the entire lower surface of the fuse part 23a since the heat or the stress is sufficiently buffered during melting disconnection of the fuse part 23a. It is more preferable that the buffer layer 25 have a size that is set to a range equal to or more than the length L and the width W of the fuse part 23 as shown in FIG. 2c.

For example, the buffer layer 25 may be formed in a multilayer structure in which a resin layer is sandwiched between inorganic substance layers of several tens nanometers. When the buffer layer 25 is made of an organic layer, it is preferable that the buffer layer 25 be made of an acrylic resin or a polyimide-novolac-based resin that is curable at relatively low temperature (for example, 70% to 80% of the resin is cured at a temperature equal to or lower than the softening point of a material constituting the support 11). When such a material is used, degradation of the support 11 due to heat and generation of outgas can be prevented in a process of curing the buffer layer 25 during production. The buffer layer 25 may be made of a porous $SiO_2$ material which is the same as that for a void-containing layer 31 described below.

The organic functional layer 21 is formed by layering a hole injection layer, a hole transport layer, a light-emitting layer, and an electron injection layer in this order on the conductive layer 19 which is the second electrode. For example, the hole injection layer has a thickness of about 10 nm, and is made of copper phthalocyanine (CuPc), the hole transport layer has a thickness of about 50 nm, and is made of bis[N-(1-naphthyl)-N-pheny]benzidine (α-NPD), the light-emitting layer has a thickness of about 50 nm, and is made of tris-(8-hydroxyquinoline)aluminum ($Alq_3$), and the electron injection layer has a thickness of about 1 nm, and is made of lithium fluoride (LiF).

The electrode strip group 17 as a cathode is for example, made of Al, or the like, and provided so as to cover the organic functional layer 21. The electrode strip group 17 extends in a direction orthogonal to the extension direction of the power supply strip group 15 to form a matrix with the power supply strip group 15. Further, the electrode strip group 17 forms an electrode pair that sandwiches the organic functional layer 21 with the conductive layer 19, and forms a connecting wire pair that supplies current to the organic EL element with the connecting wire 23. An insulating layer 27 is formed on the support 11 on which the electrode strip group 17, the power supply strip group 15, and the connecting wire 23 have been formed. Since at least an end of the conductive layer 19, an upper surface of the connecting wire 23 excluding the fuse part 23a, and an upper surface of the power supply strip group 15 are covered with the insulating layer 27, they are electrically insulated from the electrode strip group 17. As another material for the electrode strip group 17, an alloy with relatively low work function, such as Mg—Ag or Al—Li is suitable.

A sealing layer 29 is constructed by a thin film made of an inorganic material such as $SiO_x$, $SiO_xN_y$, $SiN_x$, $AlO_x$, $AlN_x$, and $TiO_x$. The sealing layer 29 has a sealing structure of entirely covering each component of the organic EL panel 10 and serving as a sealing function of preventing entry of oxygen and moisture content from the outside. The sealing layer 29 is formed so as to be in close contact with the organic EL element 13.

Between the sealing layer 29 and the fuse part 23a, a void-containing layer 31 including an aggregate of a plurality of voids intervenes. Specifically, the connecting wire 23 is in contact with the void-containing layer 31 in at least a formation part of the fuse part 23a. Therefore, the fuse part 23a of the connecting wire 23 is held between the buffer layer 25 and the void-containing layer 31.

The void-containing layer 31 is a layer having a void-containing structure that has a plurality of voids thereinside, and for example, is made of a porous material. Specifically, the void-containing layer 31 is made of a porous $SiO_2$ film that may be formed by baking an insulating material such as polysilazane at low temperature. Polysilazane is an inorganic polymer that is soluble in an organic solvent. A solution of polysilazane in an organic solvent is used as a coating solution, and baked in the air or a water vapor-containing atmosphere to obtain an amorphous $SiO_2$ film. Polysilazane is usually baked at about 400° C. However, when the baking temperature is set to about 100° C., a porous $SiO_2$ film is obtained. The void-containing layer 31 can be formed by applying polysilazane to the fuse part 23a before formation of the sealing layer 29, and baking polysilazane at low temperature. The sealing layer 29 is formed so as to also cover a surface of the void-containing layer 31.

Metal evaporated from the fuse part 23a during melting disconnection of the fuse part 23a is incorporated in the void-containing layer 31 by a capillary phenomenon, to prevent reconnection of the fuse part 23a. In the void-containing layer, heat or deforming stress during melting disconnection of the fuse part 23a is absorbed and buffered by a void structure, damage of the sealing layer 29 is prevented, and heat and deforming stress applied to the buffer layer 25 are relieved. In order to sufficiently absorb and buffer heat or stress during melting disconnection of the fuse part 23a, it is preferable that the void-containing layer 31 be formed so as to cover at least the entire upper surface of the fuse part 23a. It is more preferable that the void-containing layer 31 have a size that is set to a range equal to or more than the length 1 and the width w of the fuse part 23 as shown in FIG. 2c.

In the embodiment described above, a strip electrode 17 is used as a cathode, and the conductive layer 19 is used as an anode. However, positive and negative driving currents to be supplied may be reversed.

Figure 3:
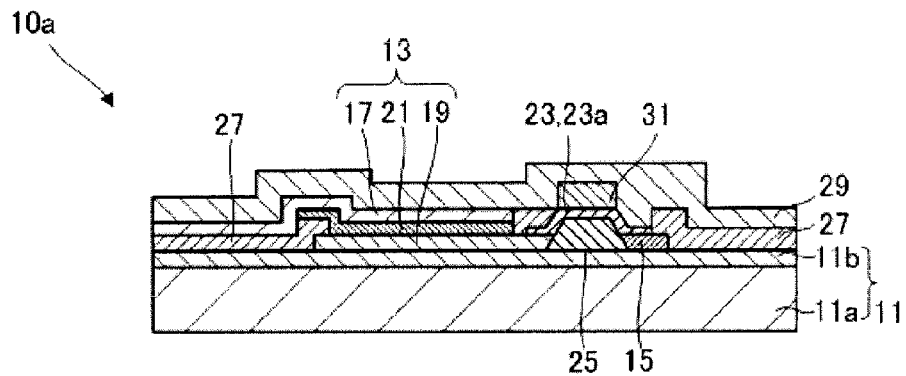
FIG. 3 is a cross-sectional view of an organic EL panel according to a modification of the present invention.
Figure 4:
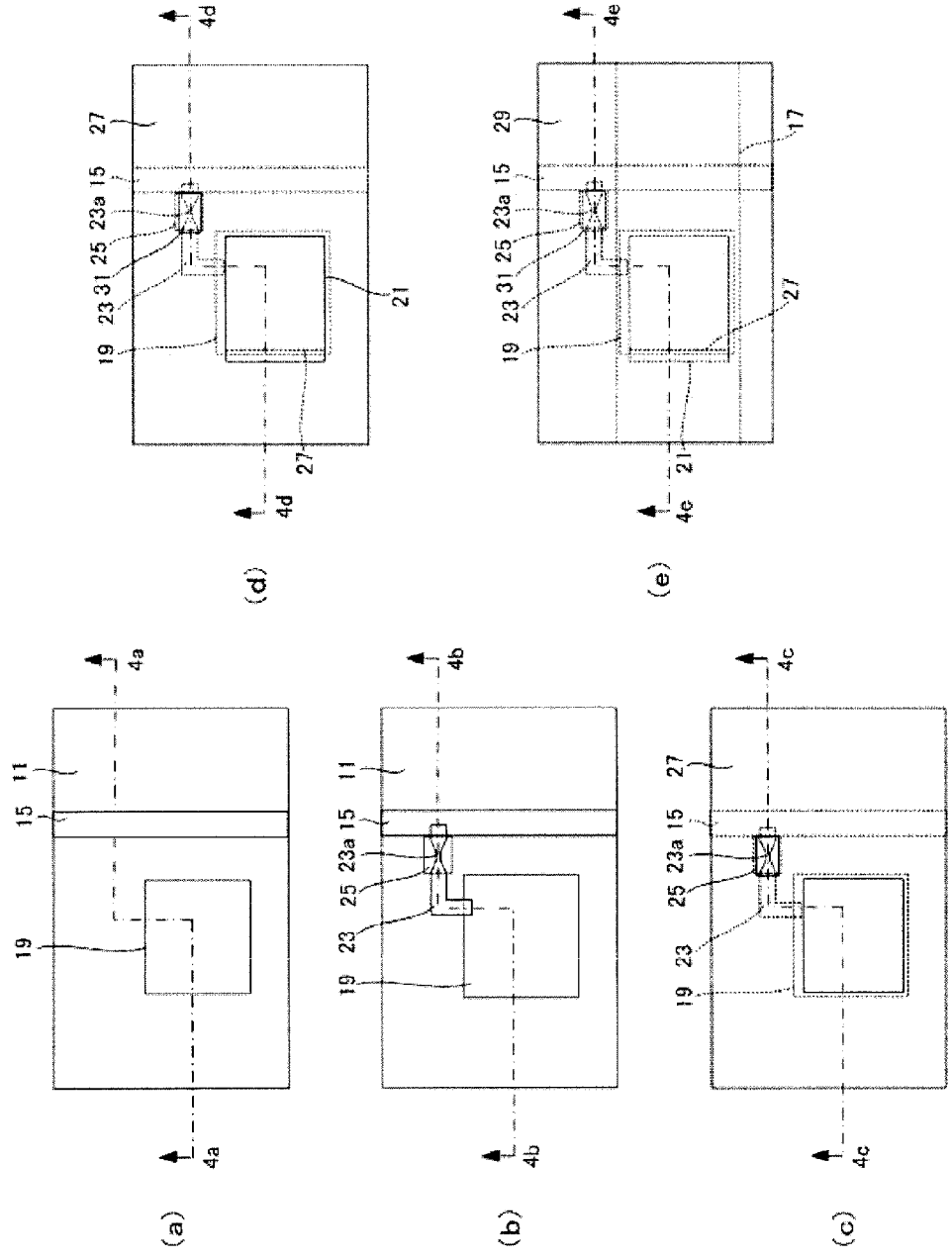
FIG. 4 is a top plan view showing each process in a method for producing the organic EL panel according to the first embodiment of the present invention.
Figure 5:
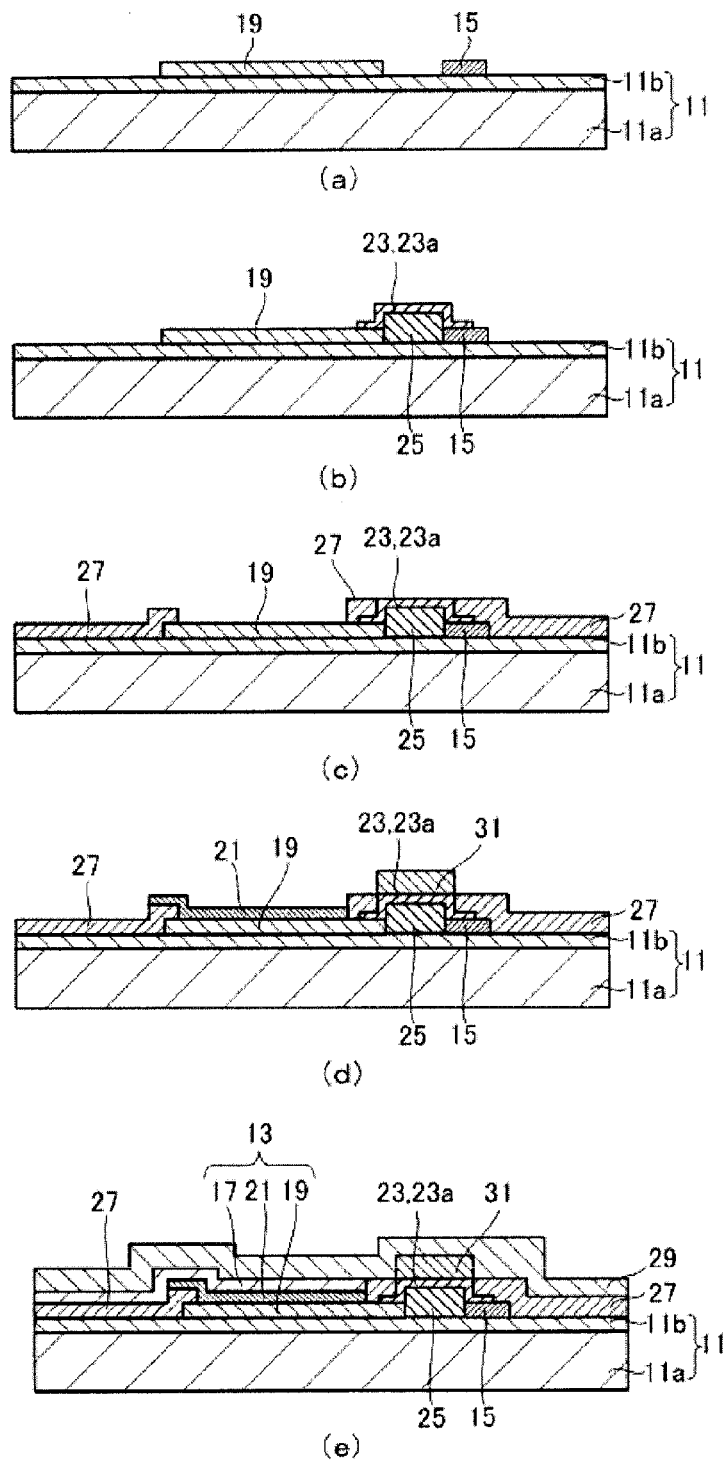
FIG. 5 includes cross-sectional views of the organic EL panel in respective processes in the production method shown in FIG. 4, that are taken along lines 4a-4a, 4b-4b, 4c-4c, 4d-4d, and 4e-4e in FIGS. 4(a) to 4(e), respectively.

In order to easily form a connecting wire 23 on a buffer layer 25 as shown in FIG. 3, it is preferable that the buffer layer 25 have a cross section with a forward tapered side, that is, a trapezoidal cross section with a lower base in contact with a support 11 and an upper base shorter than the lower base.

Hereinafter, a method for producing the organic EL panel of this embodiment will be described with reference to FIGS. 4(a) to 4(e) and 5(a) to 5(e). In production of the organic EL of the embodiment, a film as the barrier film 11b is first formed from an inorganic material such as $SiO_x$, $SiO_xN_y$, $SiN_x$, $AlO_x$, $AlN_x$, or $TiO_x$ on a transparent and flexible film substrate 11a of a resin such as polycarbonate (PC), polyester (PET), polyethylene naphthalate (PEN), or polyether sulfone (PES) to form the support 11.

Subsequently, a light-transmissive conductive metal oxide such as ITO and IZO is deposited to about 100 nm on the support 11 by a sputtering method, and patterned in a rectangular shape by etching to form the conductive layer 19. The power supply strip group 15 made of a low-resistance metal such as Al, Cu, Ag, or Au is formed at a position away from the conductive layer 19 on the support 11 by the same procedure as the procedure for forming the conductive layer 19 (FIGS. 4(a) and 5(a)).

A photoresist (polyimide, or acryl) is then applied onto the support 11 between the power supply strip group 15 and the conductive layer 19, exposed, developed, patterned, and cured to form the buffer layer 25. Herein, the buffer layer 25 may be made of an inorganic material such as $SiO_2$, and patterning may be performed by a known liftoff method or an etching method using a resist mask formed by known photolithography. As described above, the buffer layer 25 may be formed in a multilayer structure in which a resin layer is sandwiched between inorganic substance layers of several tens nanometers. In order to facilitate the formation of the connecting wire 23 on the buffer layer 25, it is preferable that the buffer layer 25 be formed so as to have a cross section with a forward tapered side, that is, a trapezoidal cross section with a lower base in contact with the support 11 and an upper base shorter than the lower base. When the buffer layer 25 is made of an organic layer, it is preferable that an acrylic resin or a polyimide-novolac-based resin that is curable at relatively low temperature (for example, 70% to 80% of the resin is cured at a temperature equal to or lower than the softening point of a material constituting the support 11) be used. When such a material is used, degradation of the support 11 due to heat and generation of outgas can be prevented in a process of curing the buffer layer 25 during production.

Subsequently, the connecting wire 23 made of an alloy including tin, bismuth, or lead as a main component, more specifically solder that is a tin-based alloy, or a low-melting point metal such as a Wood's metal, a Rose's alloy, or a Newton's alloy is formed by a mask vapor deposition method or the like. After that, the fuse part 23a is formed on the buffer layer 25 by patterning. Specifically, the connecting wire 23 is patterned so that the line width of the fuse part 23a on the buffer layer 25a is locally narrow (FIGS. 4(b) and 5(b)).

Subsequently, a photoresist (or polyimide) that is a material for the insulating layer 27 is applied so as to cover surfaces of the conductive layer 19 and the power supply strip group 15. After that, the photoresist is exposed, developed, and patterned. Thus, the insulating layer 27 is formed so as to have an opening for exposure of surfaces of the conductive layer 19 and the fuse part 23a (FIGS. 4(c) and 5(c)). The material for the insulating layer 27 and a method of patterning the insulating layer 27 are not limited to those described above. For example, similarly to the buffer layer 25 described above, the insulating layer 27 may be made of an inorganic material such as $SiO_2$, and patterning may be performed by a known liftoff method or an etching method using a resist mask formed by known photolithography.

Polysilazane is then applied onto the fuse part 23a exposed in the opening of the insulating layer 27, and baked at a low temperature of about 100° C. Thus, the void-containing layer 31 made of a porous $SiO_2$ film is formed so as to cover the fuse part 23a.

Subsequently, a hole injection layer, a hole transport layer, a light-emitting layer, and an electron injection layer are formed in turn on the exposed conductive layer 19 by an inkjet method or a mask vapor deposition method to form the organic functional layer 21. For example, the hole injection layer has a thickness of about 10 nm, and is made of copper phthalocyanine (CuPc), the hole transport layer has a thickness of about 50 nm, and is made of bis[N-(1-naphthyl)-N-phenyl]benzidine (α-NPD), the light-emitting layer has a thickness of about 50 nm, and is made of tris-(8-hydroxyquinoline)aluminum ($Alq_3$), and the electron injection layer has a thickness of about 1 nm, and is made of lithium fluoride (LiF) (FIGS. 4(d) and 5(d)).

Subsequently, Al that is an electrode material for an electrode strip group 17 is deposited in a desired pattern on the structure obtained through the respective processes described above by the vapor deposition method using a mask with an opening corresponding to the pattern of the electrode strip group 17. Thus, the electrode strip group 17 that is connected to the organic functional layer 21 and extends in a direction orthogonal to the extension direction of the power supply strip group 15 is formed. Specifically, the organic functional layer 21 is held between the electrode strip group 17 and the conductive layer 19, and the electrode strip group 17 is insulated from the power supply strip group 15 and the connecting wire 23 by the insulating layer 27.

Subsequently, an inorganic material such as $SiO_x$, $SiO_xN_y$, $SiN_x$, $AlO_x$, $AlN_x$, or $TiO_x$ is deposited by a plasma CVD method that allows an isotropic film to be formed so as to cover the structure obtained through the respective processes described above, thereby forming the sealing layer 29. The sealing layer 29 is formed so as to be in intimate contact with the organic EL element 13 (FIGS. 4(e) and 5(e)). Through the respective processes, the organic EL panel 10 is completed.

In the processes of forming the buffer layer 25, the connecting wire 23, and the insulating layer 27 as shown in FIGS. 4(b), 4(c), 5(b), and 5(c), the buffer layer 25 and the insulating layer 27 may be formed simultaneously from the same material, followed by forming the connecting wire 23 on the buffer layer 25. Thus, a production process can be simplified.

Similarly to the void-containing layer 31, the buffer layer 25 may be formed by applying polysilazane to the support 11 between the power supply strip group 15 and the conductive layer 19 followed by baking at a low temperature of about 100° C.

In the organic EL panel 10 of the embodiment, the buffer layer 25 is present between the fuse part 23a and the support 11 containing a material having low mechanical resistance or thermal resistance, such as a resin. This can prevent damage of the support 11, which may be caused when overcurrent flows from the power supply strip group 15 through the connecting wire 23 to the organic EL element 13 by short circuit between first and second electrodes, and metal constituting the connecting wire 23 is melt and evaporated with deformation and expansion. Therefore, destruction of mechanically or thermally fragile part of a barrier layer that is formed on a substrate constituting the support or the surface can be prevented, and entry of oxygen or moisture content to the organic EL panel can be prevented. Further, the durability and reliability of the organic EL panel can be improved.

The organic EL panel 10 of the embodiment has a structure in which the void-containing layer 31 is provided on the fuse part 23a and the fuse part 23a is held between the buffer layer 25 and the void-containing layer 31. In the void-containing layer, heat or deforming stress during melting disconnection of the fuse part 23a is absorbed and buffered by the void structure, damage of the sealing layer 29 is prevented, and heat and deforming stress applied to the buffer layer 25 are relieved. Therefore, when the fuse part 23a is held between the buffer layer 25 and the void-containing layer 31, damage of the organic EL panel 10 caused by melting disconnection of the fuse part 23a can be effectively prevented.

Figure 6:
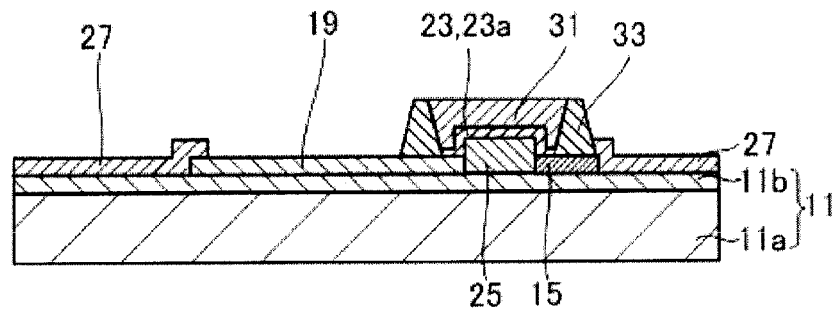
FIG. 6 is a cross-sectional view showing another method for producing the organic EL panel according to the first embodiment.
Figure 6:
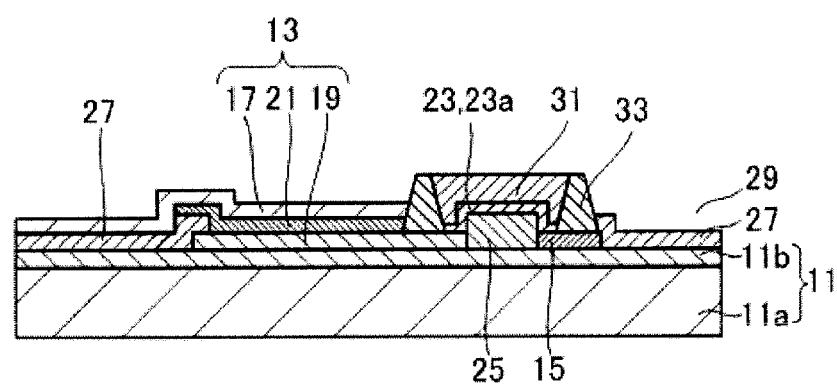
Figure 6:
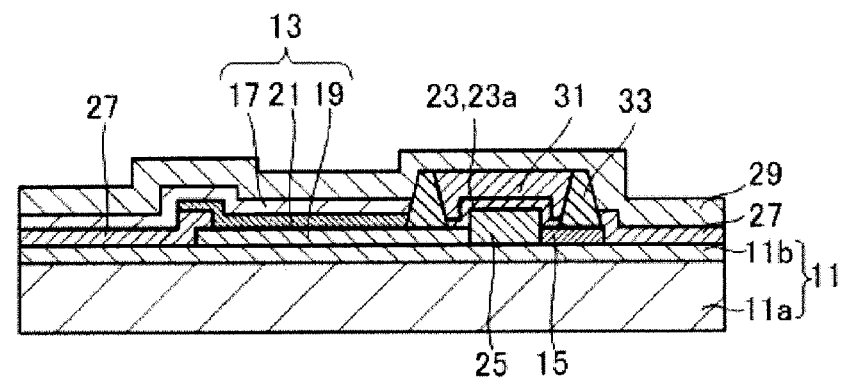

Hereinafter, another method for producing the organic EL panel 10 will be described with reference to FIGS. 6(a) to 6(c).

Similarly to the production method as described above, the support 11 is formed, the conductive layer 19 is formed on the support 11, and the power supply strip group 15 is formed. Subsequently, the buffer layer 25 is formed on the support 11 between the power supply strip group 15 and the conductive layer 19. The connecting wire 23 is then formed so that the fuse part 23a is formed on the buffer layer 25. A bank (partition part) 33 is formed so as to surround the fuse part 23a. The bank 33 is formed, for example, by forming a film from an organic material such as photosensitive polyimide followed by patterning through exposure and development processes. The bank 33 is formed as a partition surrounding the fuse part 23a. For example, the bank 33 can be formed on the conductive layer 19 and the power supply strip group 15. Subsequently, the insulating film 27 having an opening is formed at a part surrounded by the bank 33 and on the conductive layer 19. After that, polysilazane is applied to a surface of the fuse part 23a surround by the bank 33, and baked at a low temperature of about 100° C. Thus, the void-containing layer 31 made of a porous $SiO_2$ film is formed so as to cover the fuse part 23a (FIG. 6(a)).

Then, similarly to the production method, the organic functional layer 21 is formed on the conductive layer 19. An electrode strip group 17 that is connected to the organic functional layer 21 and extends in a direction orthogonal to the extension direction of the power supply strip group 15 is then formed (FIG. 6(b)).

Subsequently, the sealing layer 29 made of an inorganic material is formed so as to entirely cover the structure obtained through the respective processes described above. The sealing layer 29 is formed so as to be in intimate contact with the organic EL element 13. The sealing layer 29 is formed so as to also cover even the void-containing layer 31 (FIG. 6(c)). Through the respective processes described above, the organic EL panel 10 is completed.

For patterning of the electrode strip group 17, the same bank may be used. In this case, a partition can be formed at a part where the electrode strip group 17 is not formed, or can also be formed on the void-containing layer 31.

Second Embodiment

Figure 7:
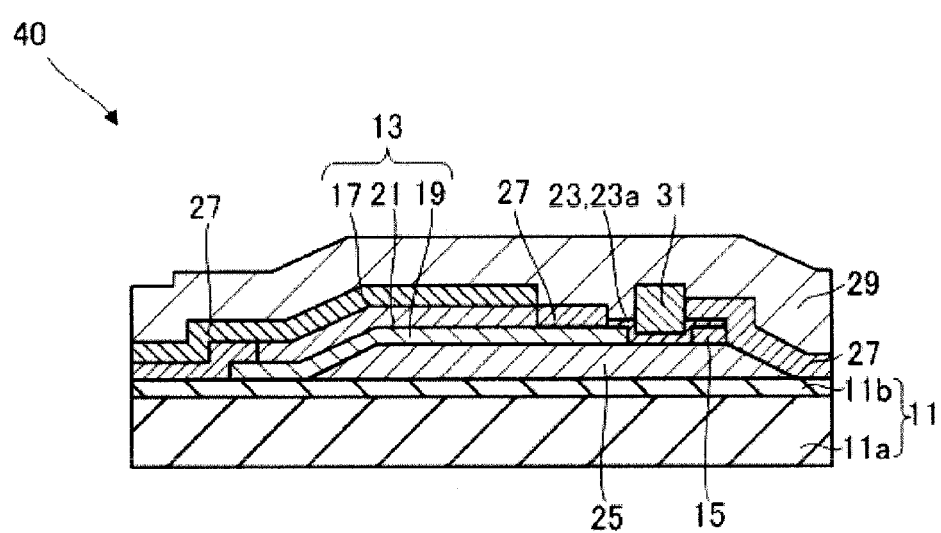
FIG. 7 is a cross-sectional view of an organic EL panel according to a second embodiment of the present invention.

FIG. 7 is a cross-sectional view showing a configuration of an organic EL panel 40 according to a second embodiment of the present invention. The organic EL panel 40 is different from the organic EL panel 10 according to the first embodiment in terms that the buffer layer 25 extends below the conductive layer 19 that is the second electrode of the organic EL element 13.

In the organic EL panel 40 according to the embodiment, a pattern used in formation of the buffer layer 25 can be expanded. Thus, a requirement for patterning accuracy can be reduced, the production cost can be made low, and the production can be made easy.

The organic EL panel 40 can be produced, for example, by the following process. A film as a barrier film 11b is formed from an inorganic material such as $SiO_x$, $SiO_xN_y$, $SiN_x$, $AlO_x$, $AlN_x$, or $TiO_x$ on a transparent and flexible film substrate 11a of a resin such as polycarbonate (PC), polyester (PET), polyethylene naphthalate (PEN), or polyether sulfone (PES) to form the support 11.

A photoresist (polyimide, or acryl) is then applied onto the support 11, exposed, developed, patterned, and cured to form the buffer layer 25. Herein, the buffer layer 25 may be made of an inorganic material such as $SiO_2$, and patterning may be performed by a known liftoff method or an etching method using a resist mask formed by known photolithography. As described above, the buffer layer 25 may be formed in a multilayer structure in which a resin layer is sandwiched between inorganic substance layers of several tens nanometers. In order to facilitate the formation of the connecting wire 23 on the buffer layer 25, it is preferable that the buffer layer 25 be formed so as to have a cross section with a forward tapered side, that is, a trapezoidal cross section with a lower base in contact with the support 11 and an upper base shorter than the lower base. When the buffer layer 25 is made of an organic layer, it is preferable that an acrylic resin or a polyimide-novolac-based resin that is curable at relatively low temperature (for example, 70% to 80% of the resin is cured at a temperature equal to or lower than the softening point of a material constituting the support 11) be used. When such a material is used, degradation of the support 11 due to heat and generation of outgas can be prevented in a process of curing the buffer layer 25 during production.

Figure 8:
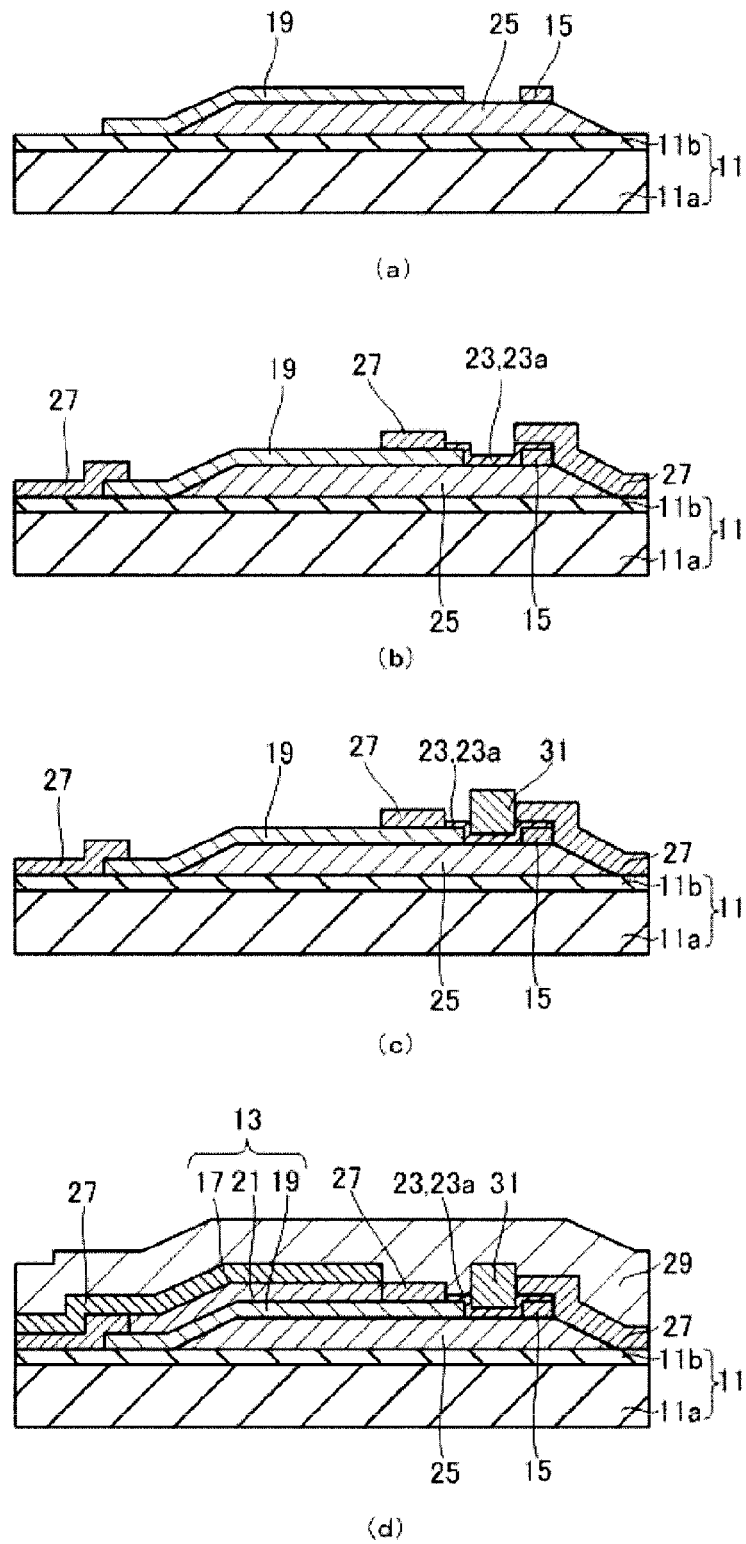
FIG. 8 is a cross-sectional view showing a method for producing the organic EL panel according to the second embodiment of the present invention.

Subsequently, a light-transmissive conductive metal oxide such as ITO and IZO is deposited to about 100 nm on the buffer layer 25 by a sputtering method, and patterned in a rectangular shape by etching to form the conductive layer 19. The power supply strip group 15 made of a low-resistance metal such as Al, Cu, Ag, or Au is formed at a position away from the conductive layer 19 on the buffer layer 25 by the same procedure as the procedure for forming the conductive layer 19 (FIG. 8(a)).

Subsequently, the connecting wire 23 made of an alloy including tin, bismuth, or lead as a main component, more specifically solder that is a tin-based alloy, or a low-melting point metal such as a Wood's metal, a Rose's alloy, and a Newton's alloy is formed by a mask vapor deposition method or the like. After that, the fuse part 23a is formed on the buffer layer 25 by patterning. Specifically, the connecting wire 23 is patterned so that the line width of the fuse part 23a on the buffer layer 25 is locally narrow.

Subsequently, a photoresist (or polyimide) that is a material for the insulating layer 27 is applied so as to cover surfaces of the conductive layer 19 and the power supply strip group 15. After that, the photoresist is exposed, developed, and patterned. Thus, the insulating layer 27 is formed so as to have an opening for exposure of the surface of the conductive layer 19 and the fuse part 23a (FIG. 8(b)). The material for the insulating layer 27 and a method of patterning the insulating layer 27 are not limited to those described above. For example, Similarly to the buffer layer 25, the insulating layer 27 may be made of an inorganic material such as $SiO_2$, and patterning may be performed by a known liftoff method or an etching method using a resist mask formed by known photolithography.

Polysilazane is then applied onto the fuse part 23a exposed in the opening of the insulating layer 27, and baked at a low temperature of about 100° C. Thus, the void-containing layer 31 made of a porous $SiO_2$ film is formed so as to cover the fuse part 23a (FIG. 8(c)).

Subsequently, a hole injection layer, a hole transport layer, a light-emitting layer, and an electron injection layer are formed in turn on the exposed conductive layer 19 by an inkjet method or a mask vapor deposition method to form the organic functional layer 21. For example, the hole injection layer has a thickness of about 10 nm, and is made of copper phthalocyanine (CuPc), the hole transport layer has a thickness of about 50 nm, and is made of bis[N-(1-naphthyl)-N-phenyl]benzidine (α-NPD), the light-emitting layer has a thickness of about 50 nm, and is made of tris-(8-hydroxyquinoline)aluminum ($Alq_3$), and the electron injection layer has a thickness of about 1 nm, and is made of lithium fluoride (LiF).

Subsequently, Al that is an electrode material for the electrode strip group 17 is deposited in a desired pattern on the structure obtained through the respective processes described above by the vapor deposition method using a mask with an opening corresponding to the pattern of the electrode strip group 17. Thus, the electrode strip group 17 that is connected to the organic functional layer 21 and extends in a direction orthogonal to the extension direction of the power supply strip group 15 is formed. Specifically, the organic functional layer 21 is held between the electrode strip group 17 and the conductive layer 19, and the conductive layer 19 is insulated from the power supply strip group 15 and the connecting wire 23 by the insulating layer 27.

Subsequently, an inorganic material such as $SiO_x$, $SiO_xN_y$, $SiN_x$, $AlO_x$, $AlN_x$, or $TiO_x$ is deposited by a plasma CVD method that allows an isotropic film to be formed so as to entirely cover the structure obtained through the processes, thereby forming the sealing layer 29. The sealing layer 29 is formed so as to be in intimate contact with the organic EL element 13 (FIG. 8(d)). Through the respective processes described above, the organic EL panel 40 is completed.

Third Embodiment

Figure 9:
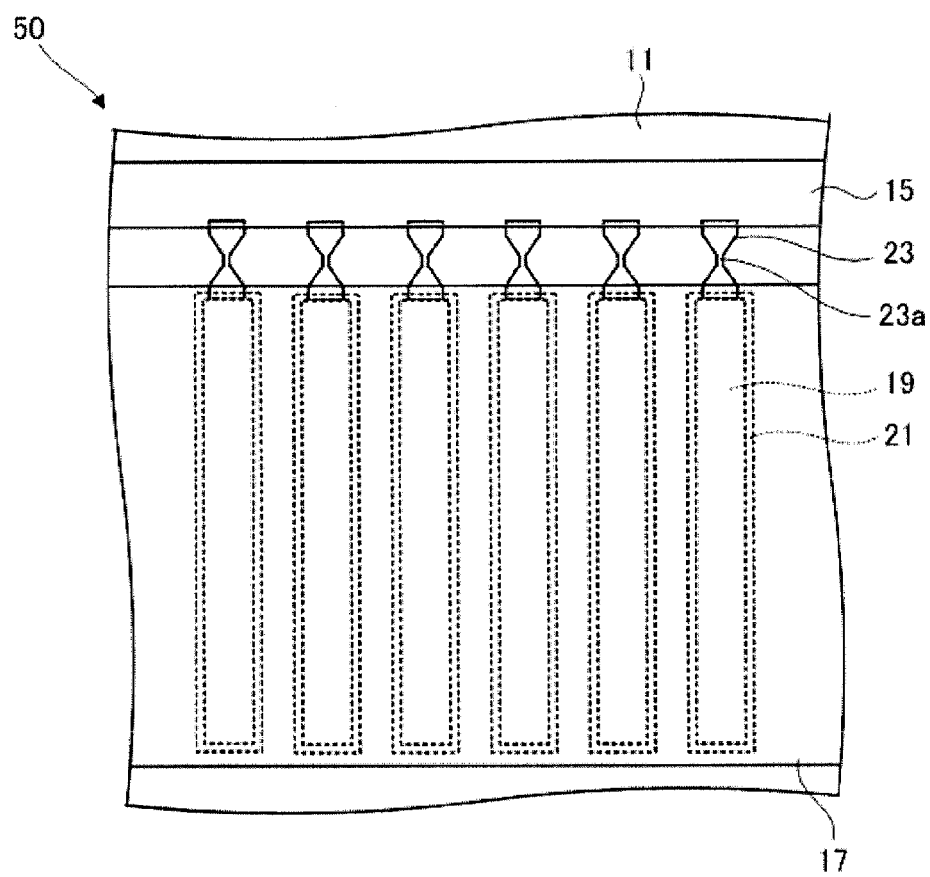
FIG. 9 is a top plan view showing a configuration of an organic EL panel according to a third embodiment of the present invention.

In the above-described embodiments, a display device in which the power supply strip group 15 and the electrode strip group 17 are arranged in a lattice shape, and each organic EL element 13 is disposed on each intersection therebetween, that is, a display device of so-called dot matrix display has been described as an example. However, the present invention is not limited to such a configuration. FIG. 9 is a top plan view showing a configuration of an organic EL panel 50 in which arrangement of an electrode, a wire, and an organic EL element is modified.

In the organic EL panel 50, the plurality of connecting wires 23 are connected to one strip in the power supply strip group 15 formed on the support 11. The connecting wires 23 are aligned at an equal interval in one part (or a plurality of parts) together, and each have the fuse part 23a similarly to the respective embodiments. Each of the connecting wires 23 is connected to the conductive layer 19 patterned in a strip shape. The organic functional layer 21 in the same strip shape is provided on the conductive layer 19. On the organic functional layer 21, the electrode strip group 17 common to the plurality of organic EL elements 13 is provided. The electrode strip group 17 extends parallel to the extension direction of the power supply strip group 15. Further, the electrode strip group 17 may be separated for every organic EL element into a strip shape, similarly to the conductive layer 19 and the organic functional layer 21. According to an arrangement where the connecting wires 23 are gathered in one part, the fuse parts 23a can be collected into one part. Therefore, patterning of a buffer layer (or forming of a void-containing layer) is made easy.

In each of the embodiments described above, the void-containing layer 31 is provided on the fuse part 23a. However, the void-containing layer 31 may not be necessarily formed, and the fuse part 23a may be in contact with the sealing layer 29. In this case, it is preferable that the buffer layer 25 be made of a porous polysilazane material that is the same as used for the void-containing layer 31 to secure a scattering space of a metal material melt during disconnection of the fuse part 23a.

Instead of formation of a void-containing layer, an opening may be formed at a part above the fuse part 23a of the sealing layer 29 so as to penetrate the fuse part 23a and the exterior. Thus, the scattering space of a metal material melt during disconnection of the fuse part 23a can be secured.

In each of the embodiments described above, the organic EL panel having the support that is a combination of a resin substrate and a barrier film has been described. However, even in another support structure, the same effects can be obtained by providing the buffer layer 25 or the void-containing layer 31. For example, even in a panel having a mechanically and thermally fragile support structure containing a resin material or a glass material around a supporting substrate such as a substrate in combination of a glass with a resin, for example, a color filter substrate, a metal substrate having an insulating film formed thereon, and a hybrid substrate of a metal and a resin, when the buffer layer 25 or the void-containing layer 31 is provided, damage of the support structure that may be caused by melting and evaporating metal constituting a connecting wire with deformation and expansion can be prevented. Therefore, a decrease in the performance of an organic EL element caused by destruction of a mechanically fragile part or a thermally fragile part can be prevented, and the durability and reliability of an organic EL panel can be improved.

In the embodiments described above, a sealing film structure in intimate contact with an organic EL element has been used as means for sealing an organic EL panel, to seal a film. However, a sealing can structure made of a metal may be formed so as to cover the organic EL element 13 on the support 11 and hollow sealing may be performed.

REFERENCE SIGNS LIST 10, 40, 50 organic EL panel
11 support
13 organic EL element
15 power supply strip group
17 electrode strip group
19 conductive layer
21 organic functional layer
23 connecting wire
23a fuse part
25 buffer layer
27 insulating layer
29 sealing layer
31 void-containing layer

The invention claimed is:

1. An organic EL panel, comprising:
   a support including a resin material;
   at least one organic EL element that is provided on the support and includes an organic functional layer including an organic light-emitting layer and a pair of electrodes sandwiching the organic functional layer;
   at least one pair of connecting wire pairs that are connected to the pair of respective electrodes and disposed on the support; and
   a sealing structure that seals the organic EL element and the connecting wire pairs together with the support,
   wherein any one of the connecting wire pairs has a fuse part, and a buffer layer is provided between the support and the fuse part; and
   a void-containing layer, with the fuse part being held between the buffer layer and the void-containing layer.

2. The organic EL panel according to claim 1, wherein the buffer layer has a cross-sectional shape of trapezoid with a lower base in contact with the support and an upper base shorter than the lower base.

3. The organic EL panel according to claim 1, further comprising an insulating layer that comprises the same material as that for the buffer layer and serves to insulate connecting wires of the connecting wire pair from each other.

4. The organic EL panel according to claim 1, wherein the buffer layer extends below at least a part of the organic EL element.

5. The organic EL panel according to claim 1, wherein the support contains at least one of a resin material and a glass material.

6. The organic EL panel according to claim 1, further comprising at least one power supply strip that is disposed on the support and relays power to the connecting wire pair, with one wire of the connecting wire pair being connected to the power supply strip, and with another wire of the connecting wire pair being integral with at least one common electrode strip crossed with the power supply strip.

7. The organic EL panel according to claim 1, wherein the sealing structure comprises a sealing film with which the organic EL element and the connecting wire pair are covered.

8. An organic EL panel comprising:
a support including a resin material;
at least one organic EL element that is provided on the support, the at least one organic EL element comprising an organic functional layer including an organic light-emitting layer and a pair of electrodes sandwiching the organic functional layer; and
a connecting wire that is connected to either one of the pair of electrodes;
wherein the connecting wire includes a narrow-width part, and
a buffer layer is provided between the support and the narrow-width part, wherein the buffer layer is in contact with the narrow width part.

9. The organic EL panel according to claim 8, further comprising:
a power supply line provided on the support; and
a plurality of the connecting wires, wherein
the power supply line is connected to the plurality of the connecting wires, and
each of the plurality of the connecting wires is connected to one electrode of a plurality of pairs of the electrodes which are patterned in a strip shape.

10. The organic EL panel according to claim 8, further comprising a void-containing layer, wherein the narrow width part is held between the buffer layer and the void-containing layer.

11. An organic EL panel comprising:
an organic EL element strip group provided on a support, each organic EL element of the organic EL element strip group comprising an organic light emitting layer disposed between one of a plurality of first electrodes and at least one second electrode;
a plurality of connecting wires, each one of the plurality of connecting wires being connected to a corresponding one of the plurality of first electrodes, and each one of the plurality of connecting wires comprising a fuse part; and
a buffer layer disposed between the support and the fuse part of the plurality of connecting wires, wherein the buffer layer is in contact with the fuse part.

12. The organic EL panel according to claim 11, wherein the support comprises a resin material.

13. The organic EL panel according to claim 11, further comprising a power supply line disposed on the support.

14. The organic EL panel according to claim 13, wherein the power supply line is connected to the plurality of connecting wires, and the fuse part of each of the plurality of connecting wires is disposed between the power supply line and the respective one of the plurality of first electrodes.

15. The organic EL panel according to claim 11, wherein the plurality of first electrodes is disposed in a striped pattern.

16. The organic EL panel according to claim 11, further comprising a void-containing layer, wherein the fuse part is held between the buffer layer and the void-containing layer.

* * * * *